United States Patent [19]

LaMonica

[11] Patent Number: 4,939,781

[45] Date of Patent: Jul. 3, 1990

[54] DEVICE FOR ELIMINATING ABSOLUTE POLARITY INVERSION IN A HIGH-FIDELITY SOUND REPRODUCTION SYSTEM

[76] Inventor: Chuck LaMonica, 121 E. 24th St., New York, N.Y. 10010

[21] Appl. No.: 270,533

[22] Filed: Nov. 14, 1988

[51] Int. Cl.[5] .......... H03S 1/00

[52] U.S. Cl. .......... 381/97; 381/24; 381/124; 439/217; 439/652

[58] Field of Search .......... 381/123, 97, 28, 124, 381/24; 439/217, 221, 222, 223, 652

[56] References Cited

U.S. PATENT DOCUMENTS

| | | | |
|---|---|---|---|
| 2,086,629 | 7/1937 | Mead . | |
| 2,158,820 | 5/1939 | Hathaway | 381/123 |
| 2,783,397 | 2/1957 | Larson . | |
| 3,148,287 | 9/1964 | Bauer et al. | 381/1 |
| 3,428,920 | 2/1969 | Oleksiak . | |
| 3,441,896 | 4/1969 | Hawkins | 439/222 |
| 3,509,356 | 4/1970 | Peebles . | |
| 3,849,600 | 11/1974 | Ohshima | 381/27 |
| 4,413,544 | 11/1983 | Sauvey . | |

*Primary Examiner*—Forester W. Isen
*Attorney, Agent, or Firm*—R. Neil Sudol; Henry D. Coleman

[57] ABSTRACT

A device for eliminating Absolute Polarity inversion in a high-fidelity sound reproduction system, wherein the sound reproduction system includes a component for extracting, from a storage medium, an electrical signal coding audio frequencies, the sound reproduction system further including a component for amplifying the electrical signal. The device comprises a housing, an input terminal, a first output terminal and a second output terminal. The input terminal includes a first electrical input conductor or contact and a second electrical input conductor or contact both mounted to the housing. Similarly, the first output terminal includes a first electrical output conductor or contact and a second electrical output conductor or contact both mounted to the housing, while the second output terminal includes a third electrical output conductor or contact and a fourth electrical output conductor or contact both mounted to the housing. The third electrical output conductor and the fourth electrical output conductor have a configuration relative to one another substantially identical to a relative configuration of the first electrical output conductor and the second electrical output conductor. Electrically conductive connectors are provided for connecting the first electrical input conductor to the first electrical output conductor and the fourth electrical output conductor and for connecting the second electrical input conductor to the second electrical output conductor and the third electrical output conductor.

15 Claims, 2 Drawing Sheets

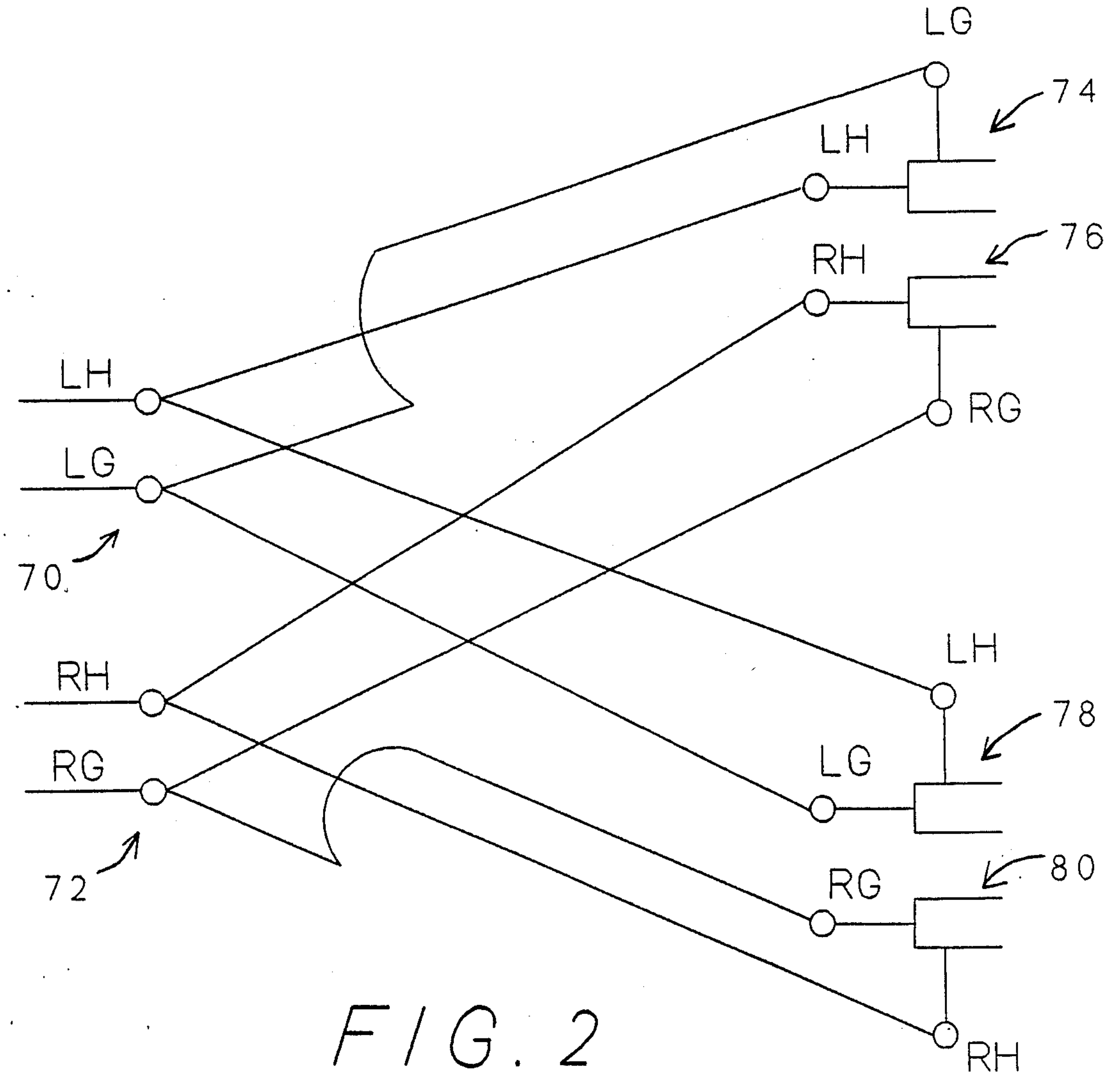
F/G. 2

DEVICE FOR ELIMINATING ABSOLUTE POLARITY INVERSION IN A HIGH-FIDELITY SOUND REPRODUCTION SYSTEM

BACKGROUND OF THE INVENTION

This invention relates to a device for eliminating Absolute Polarity inversion in a high-fidelity sound reproduction system. More particularly, this invention relates to a device usable with existing stereophonic sound reproduction systems for eliminating Absolute Polarity inversion therein.

Music and sound consist of pressure waves having "peaks" and "valleys." Should one desire to make a sound recording, the following conditions should exist:

(A) A "peak" should cause a positive movement in a microphone diaphragm at the time of the original recording and will result in a positive or forward movement in both loudspeakers upon playback.

(B) If the opposite result occurs and the "peak" in the original live sound causes a negative or rearward motion in both loudspeakers during playback, the output of the sound reproduction system can be said to be in inverted Absolute Polarity.

The causes of Absolute Polarity inversion can be that the Absolute Polarity of the recording itself is inverted or that a component in the sound reproduction system is producing an Absolute Polarity inverted signal.

Absolute Polarity should not be confused with Relative Polarity. Incorrect Relative Polarity exists when a positive movement in the diaphragm of a recording microphone results, during playback of the recorded sound, in a positive movement in one loudspeaker and a negative movement in another loudspeaker. Correct Relative Polarity exists when a positive movement in the microphone diaphragm results, during playback, in both loudspeakers moving in the same direction (without regard as to whether this movement is positive or negative, thence in correct or inverted Absolute Polarity).

Well known techniques for compensating for Absolute Polarity inversion include the reversal of wires at the input terminals of speakers or at the output terminals of amplifiers. Alternatively, leads at the output terminals of an audio signal extraction component such as a phonograph cartridge may be reversed. A disadvantage of such a technique arises from the inconvenient location of the terminals of such components or the complexity of reversing certain leads such as cartridge leads. The terminals are frequently in places which are difficult to reach. Such a correction for Absolute Polarity inversion may thus require a major effort at rewiring. This effort is all the more burdensome if several successive played sound recordings each necessitate rewiring to adjust for the respective Absolute Polarities of the recordings.

Another technique for compensating for Absolute Polarity inversion involves the incorporation of an Absolute Polarity inverting switch in the sound reproduction system, for example, upstream of a preamplifier and downstream of a stereophonic cartridge. Such a method, however, is undesirable because it introduces additional distortion and signal degradation into the system.

OBJECTS OF THE INVENTION

An object of the present invention is to provide a device for eliminating or facilitating the elimination of Absolute Polarity inversion in a high-fidelity sound reproduction system.

Another object of the present invention is to provide such a device which can be used in existing high-fidelity sound reproduction systems.

Another, more particular, object of the present invention is to provide such a device which results in a minimum degradation of an audio frequency signal and a consequent maximizing of audio fidelity.

A further particular object of the present invention is to provide such a device which is utilizable in high-fidelity sound reproduction systems for inverting Absolute Polarity without the aid of a switch.

SUMMARY OF THE INVENTION

The present invention is directed to a device for eliminating Absolute Polarity inversion in a high-fidelity sound reproduction system, wherein the sound reproduction system includes a component for extracting, from a storage medium, an electrical signal coding audio frequencies, the sound reproduction system further including a component for amplifying the electrical signal. In accordance with the present invention, a device for eliminating Absolute Polarity inversion comprises a housing, an input terminal, a first output terminal and a second output terminal. The input terminal comprises a first electrical input conductor or contact and a second electrical input conductor or contact both mounted to the housing. Similarly, the first output terminal includes a first electrical output conductor or contact and a second electrical output conductor or contact both mounted to the housing, while the second output terminal includes a third electrical output conductor or contact and a fourth electrical output conductor or contact both mounted to the housing. The third electrical output conductor and the fourth electrical output conductor have a configuration relative to one another substantially identical to a relative configuration of the first electrical output conductor and the second electrical output conductor. Electrically conductive connectors are provided for connecting the first electrical input conductor to the first electrical output conductor and the fourth electrical output conductor and for connecting the second electrical input conductor to the second electrical output conductor and the third electrical output conductor. Insulation is provided for insulating the first electrical input conductor from the second electrical input conductor, the first electrical output conductor from the second electrical output conductor and the third electrical output conductor from the fourth electrical output conductor.

Pursuant to another feature of the present invention, additional connector elements are provided for enabling connection of the input terminal to the extraction component of the sound reproduction system and for enabling connection of the first output terminal and the second output terminal alternately to the amplification component of the sound reproduction system.

Pursuant to a particular feature of the present invention, the additional connector elements for enabling connection of the input terminal to the extraction component and for enabling connection of the first output terminal and the second output terminal alternately to the amplification component include coaxial contacts of the input terminal and the output terminals.

In a specific embodiment of the instant invention, the electrically conductive connectors include wires and soldered joints connecting the first electrical input conductor to the first electrical output conductor and the fourth electrical output conductor and connecting the second electrical input conductor to the second electrical output conductor and the third electrical output conductor.

Preferably, each of the input terminal, the first output terminal and the second output terminal is a coaxial terminal. In this case, the first electrical input conductor is disposed coaxially inwardly of the second electrical input conductor, while the first electrical output conductor is disposed coaxially inwardly of the second electrical output conductor and the third electrical output conductor is disposed coaxially inwardly of the fourth electrical output conductor.

The present invention is also directed to a method for eliminating Absolute Polarity inversion in a high-fidelity sound reproduction system, wherein the sound reproduction system includes an extraction component (such as a stereo cartridge) for extracting, from a storage medium (such as a stereo disk), an electrical signal coding audio frequencies, the sound reproduction system further including an amplification component for amplifying the electrical signal. A method in accordance with the present invention comprises the initial step of providing a device having a dual conductor input terminal and two dual conductor output terminals, the conductors of a preselected one of the output terminals being connected in the same Absolute Polarity configuration to the conductors of the input terminal and the conductors of the other one of the output terminals being connected in an opposite or inverted polarity configuration to the conductors of the input terminal. In a series of subsequent steps, the input terminal of the device is connected to the extraction component of the sound reproduction system, and a first one of the output terminals is connected to the amplification component of the sound reproduction system, a second one of the output terminals being left disconnected from the amplification component. A person then listens to sound reproduced via the sound reproduction system. The first one of the output terminals is subsequently disconnected from the amplification component and the second one of the output terminals is connected thereto upon a detecting of an Absolute Polarity inversion in the reproduced sound.

The invention is broadly characterizable as a method and apparatus utilizable in stereophonic reproduction systems for eliminating or facilitating the elimination of Absolute Polarity inversion without the aid of a switch. A method and apparatus in accordance with the invention enables the correction or elimination of Absolute Polarity inversion (whereby, for example, the word "pop" pronounced aloud in the normal way is heard as pronounced during an inhalation) with a minimum degradation of the audio frequency signal and a consequent maximizing of audio fidelity.

BRIEF DESCRIPTION OF THE DRAWING

FIG. 2 is a schematic diagram of a device for eliminating or facilitating the elimination of Absolute Polarity inversion in a high-fidelity sound reproduction system, according to the present invention.

DETAILED DESCRIPTION

Figure 1:
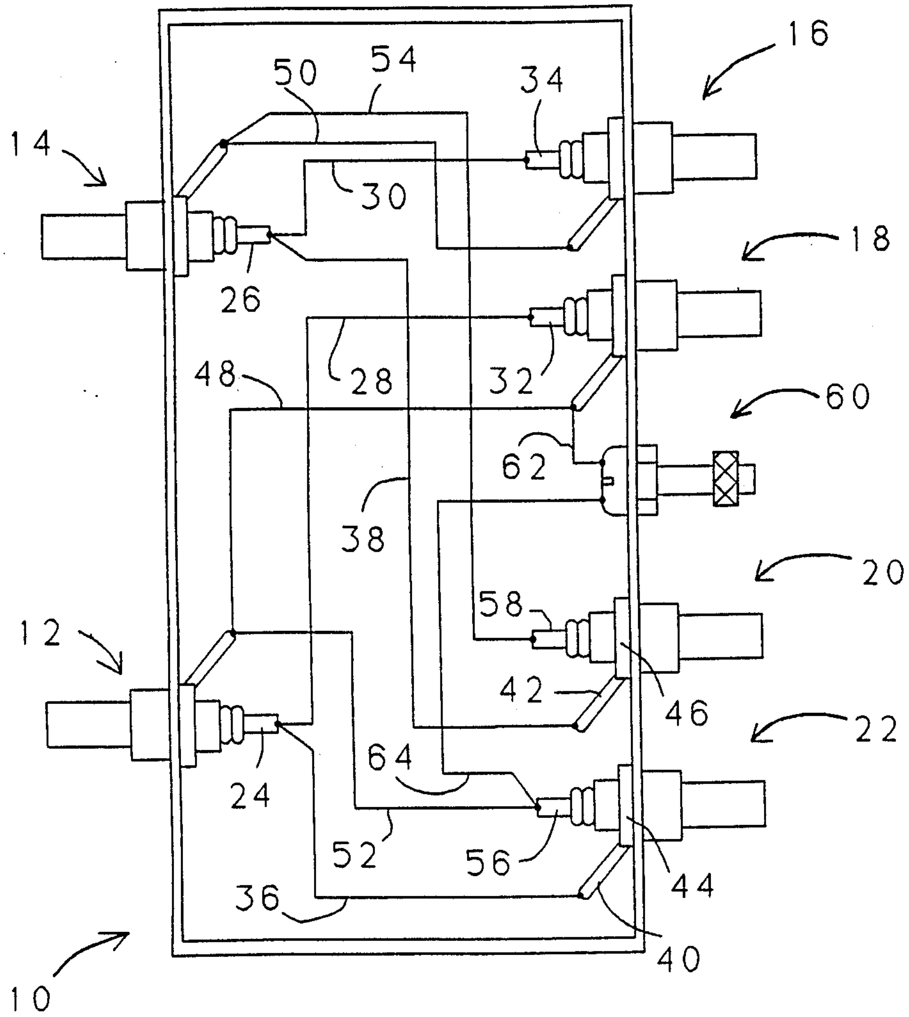
FIG. 1 is a top view of a device for eliminating or facilitating the elimination of Absolute Polarity inversion in a high-fidelity sound reproduction system, according to the present invention.

Pursuant to a specific embodiment of the invention, illustrated in FIG. 1, a connection box 10 includes a housing 11 provided on one side with a pair of coaxial input terminals 12 and 14 and on an opposite side with a first pair of coaxial output terminals 16 and 18 and a second pair of coaxial output terminals 20 and 22. The connection box is placed at a point in a stereophonic sound reproduction system upstream of an amplification stage such as a preamplifier (not illustrated) and downstream of a signal source such as a phonograph cartridge (not shown). A pair of input cables (not shown) are connectable to external contacts, e.g. outer coaxial contacts **12*a* and 12*b*, of input terminals 12 and 14**.

Normally, a pair of output cables (not illustrated) are connected to the first pair of output terminals 16 and 18. The output cables extend to a preamplification stage in the stereophonic sound reproduction system. In such a circuit configuration, terminals 14 and 16, for example, respectively correspond to the left channel input and output terminals of the device of FIG. 1. Concomitantly, terminals 12 and 18 respectively correspond to the right channel input and output terminals.

Upon detecting from the quality of sound being reproduced by the stereo system that the Absolute Polarity is negative or inverted rather than positive, a listener manually unplugs the output cables from the first pair of output terminals 16 and 18 and reconnects the cables to the second set of output terminals 20 and 22. That reconnected configuration of the circuit may be termed an inverted or negative configuration. If, however, the upstream signal is Absolute Polarity inverted, then the signal exiting terminals 20 and 22 may be termed Absolute Polarity correct.

In the inverted or negative configuration of the device, terminals 20 and 22 constitute the left and right channel output terminals, respectively.

As shown in FIG. 1, input terminals 12 and 14 have center pins or conductors 24 and 26 connected via respective leads 28 and 30 to center pins 32 and 34 of output terminals 18 and 16, respectively. Input terminal center pins 24 and 26 are also connected via respective leads 36 and 38 to conductive fingers 40 and 42 of output terminals 20 and 22. Fingers 40 and 42 are integral with rings 44 and 46 in turn operatively connected to outer coaxial contacts **22*a* and 20*a* of terminals 22 and 20**.

As further depicted in FIG. 1, outer coaxial contacts **12*a* and 14*a* of input terminals 12 and 14 are connected via respective conductive rings 45 and 47, conductive fingers 49 and 51 and leads 48 and 50 to conductive fingers 53 and 55 of output terminals 18 and 16, respectively. Fingers 53 and 55 are in turn attached to conductive rings 57 and 59 which are in operative engagement with outer coaxial contacts 14*a* and 16*a* of terminals 18 and 16. Outer coaxial contacts 12*a* and 14*a* of input terminals 12 and 14 are also operatively connected via leads 52 and 54 to center pins 56 and 58 of output terminals 22 and 20, respectively. The center pins of input terminals 12 and 14 and output terminals 16, 18, 20 and 22** are integral with or conductively connected to coaxial inner contacts (not shown) of the respective terminals.

Housing 11 is provided with a grounding post 60 in the form of a conductive screw mounted to the housing and connected by short wires 62 and 64 to finger 53 and center pin 56. In the event that an audible hum is heard during the playback of a sound recording by a sound reproduction system incorporating the device of FIG. 1, a wire may be inserted between grounding post 60 and a grounding post on the sound systems preamplifier to eliminate the hum.

In accordance with a general embodiment of the instant invention, illustrated in FIG. 2, left and right dual-lead cables 70 and 72 extending from a signal source such as a compact disk pick-up device or tape head are connected to a pair of normal Absolute Polarity terminals 74 and 76 and to a pair of inverted phase terminals 78 and 80. When dual-lead output cables (not illustrated) are operatively connected to the normal Absolute Polarity terminals 74 and 76, the signal carried by the dual-lead output cables has the same Absolute Polarity as the signal carried by input cables 70 and 72. When, on the other hand, the output cables are operatively connected to the inverted Absolute Polarity terminals 78 and 80, the Absolute Polarity or phase of the output signal is inverted with respect to the Absolute Polarity of the signal carried by input cables 70 and 72.

If a switch or other additional component were inserted between the input terminals and the output terminals to achieve an Absolute Polarity inversion, the resulting output signal would be degraded. In contrast, a method and apparatus in accordance with the invention results in no signal degradation in excess of the minimum required by the simplest circuit and the minimum number of components.

Although the invention has been described in terms of particular embodiments and applications, one of ordinary skill in the art, in light of this teaching, can generate additional embodiments and modifications without departing from the spirit of or exceeding the scope of the claimed invention. For example, the Absolute Polarity inversion device illustrated in FIG. 1 might be modified to include only one input terminal (e.g., 14) and two output terminals (e.g., 16 and 20) for a monophonic sound reproduction system. Moreover, as shown in FIG. 2, the input and output terminals of an Absolute Polarity inversion device in accordance with the invention need not be of the coaxial type. Accordingly, it is to be understood that the drawings and descriptions herein are preferred by way of example to facilitate comprehension of the invention and should not be construed to limit the scope thereof.

What is claimed is:

1. A device for eliminating Absolute Polarity inversion in a high-fidelity sound reproduction system, comprising:

a housing;

a coaxial input terminal comprising a first electrical input contact and a second electrical input contact both mounted to said housing;

a first coaxial output terminal comprising a first electrical output contact and a second electrical output contact both mounted to said housing;

a second coaxial output terminal comprising a third electrical output contact and a fourth electrical output contact both mounted to said housing, said third electrical output contact and said fourth electrical output contact having a configuration relative to one another substantially identical to a relative configuration of said first electrical output contact and said second electrical output contact;

electrically conductive connection means for connecting said first electrical input contact to said first electrical output contact and said fourth electrical output contact and for connecting said second electrical input contact to said second electrical output contact and said third electrical output contact; and insulation means for insulating said first electrical input contact from said second electrical input contact, said first electrical output contact from said second electrical output contact and said third electrical output contact from said fourth electrical output contact.

2. The device defined in claim 1 wherein said electrically conductive connection means includes wires and soldered joints connecting said first electrical input contact to said first electrical output contact and said fourth electrical output contact and connecting said second electrical input contact to said second electrical output contact and said third electrical output contact.

3. The device defined in claim 1 wherein said first electrical input contact is disposed coaxially inwardly of said second electrical input contact, said first electrical output contact is disposed coaxially inwardly of said second electrical output contact, and said third electrical output contact is disposed coaxially inwardly of said fourth electrical output contact.

4. The device defined in claim 1 wherein said housing is made of electrically insulating material and said insulation means includes portions of said housing.

5. A device for eliminating Absolute Polarity inversion in a high-fidelity sound reproduction system, said sound reproduction system including extraction means for extracting, from a storage medium, an electrical signal coding audio frequencies, said sound reproduction system further including amplification means for amplifying said electrical signal, said device comprising:

a housing;

an input terminal comprising a first electrical input conductor and a second electrical input conductor both mounted to said housing;

means for enabling connection of said input terminal to the extraction means of the sound reproduction system;

a first output terminal comprising a first electrical output conductor and a second electrical output conductor both mounted to said housing;

a second output terminal comprising a third electrical output conductor and a fourth electrical output conductor both mounted to said housing, said third electrical output conductor and said fourth electrical output conductor having a configuration relative to one another substantially identical to a relative configuration of said first electrical output conductor and said second electrical output conductor;

means for enabling connection of said first output terminal and said second output terminal alternately to said amplification means, said means for enabling connection of said input terminal to said extraction means including coaxial contacts of said input terminal, said means for enabling connection of said first output terminal and said second output terminal alternately to said amplification means including coaxial contacts of said first output terminal and said second output terminal;

electrically conductive connection means for connecting said first electrical input conductor to said first electrical output conductor and said fourth electrical output conductor and for connecting said second electrical input conductor to said second electrical output conductor and said third electrical output conductor; and insulation means for insulating said first electrical input conductor from said second electrical input conductor, said first electrical output conductor from said second electrical output conductor and said third electrical output conductor from said fourth electrical output conductor.

6. The device defined in claim 5 wherein said housing is made of electrically insulating material and said insulation means includes portions of said housing.

7. The device defined in claim 5 wherein said electrically conductive connection means includes wires and soldered joints connecting said first electrical input contact to said first electrical output contact and said fourth electrical output contact and connecting said second electrical input contact to said second electrical output contact and said third electrical output contact.

8. The device defined in claim 5 wherein said first electrical input contact is disposed coaxially inwardly of said second electrical input contact, said first electrical output contact is disposed coaxially inwardly of said second electrical output contact, and said third electrical output contact is disposed coaxially inwardly of said fourth electrical output contact.

9. A device for eliminating Absolute Polarity inversion in a high-fidelity sound reproduction system, comprising:

a housing;

an input terminal comprising a first electrical input contact and a second electrical input contact both mounted to said housing;

a first output terminal comprising a first electrical output contact and a second electrical output contact both mounted to said housing;

a second output terminal comprising a third electrical output contact and a fourth electrical output contact both mounted to said housing, said third electrical output contact and said fourth electrical output contact having a configuration relative to one another substantially identical to a relative configuration of said first electrical output contact and said second electrical output contact, each of said input terminal, said first output terminal and said second output terminal being a coaxial terminal, said first electrical input contact being being disposed coaxially inwardly of said second electrical input contact, said first electrical output contact being disposed coaxially inwardly of said second electrical output contact, said third electrical output contact being disposed coaxially inwardly of said fourth electrical output contact;

electrically conductive connection means for connecting said first electrical input contact to said first electrical output contact and said fourth electrical output contact and for connecting said second electrical input contact to said second electrical output contact and said third electrical output contact; and insulation means for insulating said first electrical input contact from said second electrical input contact, said first electrical output contact from said second electrical output contact and said third electrical output contact from said fourth electrical output contact.

10. A device for eliminating Absolute Polarity inversion in a high-fidelity stereophonic sound reproduction system, comprising:

a housing;

a first input terminal comprising a first electrical input contact and a second electrical input contact both mounted to said housing;

a second input terminal comprising a third electrical input contact and a fourth electrical input contact both mounted to said housing;

a first output terminal comprising a first electrical output contact and a second electrical output contact both mounted to said housing;

a second output terminal comprising a third electrical output contact and a fourth electrical output contact both mounted to said housing, said third electrical output contact and said fourth electrical output contact having a configuration relative to one another substantially identical to a relative configuration of said first electrical output contact and said second electrical output contact;

a third output terminal comprising a fifth electrical output contact and a sixth electrical output contact both mounted to said housing;

a fourth output terminal comprising a seventh electrical output contact and an eighth electrical output contact both mounted to said housing, said seventh electrical output contact and said eighth electrical output contact having a configuration relative to one another substantially identical to a relative configuration of said fifth electrical output contact and said sixth electrical output contact;

each of said first input terminal, said second input terminal, said first output terminal, said second output terminal, said third output terminal, and said fourth output terminal being a coaxial terminal;

first electrically conductive connection means for connecting said first electrical input contact to said first electrical output contact and said fourth electrical output contact and for connecting said second electrical input contact to said second electrical output contact and said third electrical output contact;

second electrically conductive connection means for connecting said third electrical input contact to said fifth electrical output contact and said eighth electrical output contact and for connecting said fourth electrical input contact to said sixth electrical output contact and said seventh electrical output contact; and insulation means for insulating said first electrical input contact from said second electrical input contact, said third electrical input contact from said fourth electrical input contact, said first electrical output contact from said second electrical output contact, said third electrical output contact from said fourth electrical output contact, said fifth electrical output contact from said sixth electrical output contact, and said seventh electrical output contact from said eighth electrical output contact.

11. The device defined in claim 10 wherein each of said first electrically-conductive connection means and said second electrically conductive connection means included wires and soldered joints.

12. A device for eliminating Absolute Polarity inversion in a high-fidelity stereophonic sound reproduction system, comprising:

a housing;

a first input terminal comprising a first electrical input contact and a second electrical input contact both mounted to said housing;

a second input terminal separate and electrically insulated from said first input terminal, said second input terminal comprising a third electrical input contact and a fourth electrical input contact both mounted to said housing;

a first output terminal comprising a first electrical output contact and a second electrical output contact both mounted to said housing;

a second output terminal comprising a third electrical output contact and a fourth electrical output contact both mounted to said housing, said third electrical output contact and said fourth electrical output contact having a configuration relative to one another substantially identical to a relative configuration of said first electrical output contact and said second electrical output contact;

a third output terminal comprising a fifth electrical output contact and a sixth electrical output contact both mounted to said housing;

a fourth output terminal comprising a seventh electrical output contact and an eighth electrical output contact both mounted to said housing, said seventh electrical output contact and said eighth electrical output contact having a configuration relative to one another substantially identical to a relative configuration of said fifth electrical output contact and said sixth electrical output contact, each of said third output terminal and said fourth output terminal being separate and electrically insulated from each of said first output terminal and said fourth output terminal;

first electrically conductive connection means for connecting said first electrical input contact to said first electrical output contact and said fourth electrical output contact and for connecting said second electrical input contact to said second electrical output contact and said third electrical output contact;

second electrically conductive connection means for connecting said third electrical input contact to said fifth electrical output contact and said eighth electrical output contact and for connecting said fourth electrical input contact to said sixth electrical output contact and said seventh electrical output contract; and insulation means for insulating said first electrical input contact, said second electrical input contact, said third electrical input contact, and said fourth electrical input contact from each other, and for insulating said first electrical output contact from said second electrical output contact, said third electrical output contract from said fourth electrical output contact, said fifth electrical output contact from said sixth electrical output contact, and said seventh electrical output contact from said eighth electrical output contact.

13. A device for eliminating Absolute Polarity inversion in a high-fidelity stereophonic sound reproduction system, said sound reproduction system including extraction means for extracting, from a storage medium, an electrical signal coding audio frequencies, said sound reproduction system further including amplification means for amplifying said electrical signal, said device comprising:

a housing;

a first input terminal comprising a first electrical input conductor and a second electrical input conductor both mounted to said housing;

a second input terminal comprising a third electrical input conductor and a fourth electrical input conductor both mounted to said housing;

means for enabling connection of said first input terminal and said second input terminal to the extraction means of the sound reproduction system, said means for enabling connection of said first input terminal and said second input terminal to said extraction means including coaxial contacts of said first input terminal and said second input terminal;

a first output terminal comprising a first electrical output conductor and a second electrical output conductor both mounted to said housing;

a second output terminal comprising a third electrical output conductor and a fourth electrical output conductor both mounted to said housing, said third and said fourth electrical output conductor having a configuration relative to one another substantially identical to a relative configuration of said first and said second electrical output conductor;

a third output terminal comprising a fifth electrical output conductor and a sixth electrical output conductor both mounted to said housing;

a fourth output terminal comprising a seventh electrical output conductor and an eighth electrical output conductor both mounted to said housing, said seventh and said eighth electrical output conductor having a configuration relative to one another substantially identical to a relative configuration of said fifth and said sixth electrical output conductor;

means for enabling connection of said first output terminal and said third output terminal and alternately said second output terminal and said fourth output terminal to said amplification means, said means for enabling connection of said first output terminal and said second output terminal and alternately said third output terminal and said fourth output terminal to said amplification means including coaxial contacts of said first output terminal, said second output terminal, said third output terminal and said fourth output terminal;

first electrically conductive connection means for connecting said first electrical input conductor to said first electrical output conductor and said fourth electrical output conductor and for connecting said second electrical input conductor to said second electrical output conductor and said third electrical output conductor;

second electrically conductive connection means for connecting said third electrical input conductor to said fifth electrical output conductor and said eighth electrical output conductor and for connecting said fourth electrical input conductor to said sixth electrical output conductor and said seventh electrical output conductor; and insulation means for insulating said first electrical input conductor from said second electrical input conductor, said third electrical input conductor from said fourth electrical input conductor, said first electrical output conductor from said second electrical output conductor, said third electrical output conductor from said fourth electrical output conductor, said fifth electrical output conductor from said sixth electrical output conductor, and said seventh electrical output conductor from said eighth electrical output conductor.

14. The device defined in claim 13 wherein each of said first electrically conductive connection means and said second electrically conductive connection means includes wires and soldered joints.

15. A device for eliminating Absolute Polarity inversion in a high-fidelity stereophonic sound reproduction system, said sound reproduction system including extraction means for extracting, from a storage medium, an electrical signal coding audio frequencies, said sound reproduction system further including amplification means for amplifying said electrical signal, said device comprising:

a housing;

a first input terminal comprising a first electrical input conductor and a second electrical input conductor both mounted to said housing;

a second input terminal comprising a third electrical input conductor and a fourth electrical input conductor both mounted to said housing;

means for enabling connection of said first input terminal and said second input terminal to the extraction means o f the sound reproduction system;

a first output terminal comprising a first electrical output conductor and a second electrical output conductor both mounted to said housing;

a second output terminal comprising a third electrical output conductor and a fourth electrical output conductor both mounted to said housing, said third and said fourth electrical output conductor having a configuration relative to one another substantially identical to a relative configuration of said first and said second electrical output conductor:

a third output terminal comprising a fifth electrical output conductor and a sixth electrical output conductor both mounted to said housing;

a fourth output terminal comprising a seventh electrical output conductor and an eighth electrical output conductor both mounted to said housing, said seventh and said eighth electrical output conductor having a configuration relative to one another substantially identical to a relative configuration of said fifth and said sixth electrical output conductor;

means for enabling connection of said first output terminal and said third output terminal and alternately said second output terminal and said fourth output terminal to said amplification means;

first electrically conductive connection means for connecting said first electrical input conductor to said first electrical output conductor and said fourth electrical output conductor and for connecting said second electrical input conductor to said second electrical output conductor and said third electrical output conductor;

second electrically conductive connection means for connecting said third electrical input conductor to said fifth electrical output conductor and said eighth electrical output conductor and for connecting said fourth electrical input conductor to said sixth electrical output conductor and said seventh electrical output conductor; and insulation means for insulating said first electrical input conductor from said second electrical input conductor, said third electrical input conductor from said fourth electrical input conductor, said first electrical output conductor from said second electrical output conductor, said third electrical output conductor from said fourth electrical output conductor, said fifth electrical output conductor from said sixth electrical output conductor, and said seventh electrical output conductor from said eighth electrical output conductor.

* * * * *